United States Patent
Huang et al.

(10) Patent No.: US 7,302,628 B2
(45) Date of Patent: Nov. 27, 2007

(54) DATA COMPRESSION WITH INCREMENTAL REDUNDANCY

(75) Inventors: Wensheng Huang, Cary, NC (US); Raymond Toy, Cary, NC (US); Peter Malm, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 321 days.

(21) Appl. No.: 10/911,297

(22) Filed: Aug. 4, 2004

(65) Prior Publication Data

US 2005/0138530 A1    Jun. 23, 2005

Related U.S. Application Data

(63) Continuation-in-part of application No. 09/735,495, filed on Dec. 14, 2000, now Pat. No. 6,981,060, and a continuation of application No. 10/645,560, filed on Aug. 22, 2003.

(51) Int. Cl.
*H04L 1/18* (2006.01)

(52) U.S. Cl. ..................................................... 714/751

(58) Field of Classification Search ............... 714/751; H04L 1/18
See application file for complete search history.

(56) References Cited

U.S. PATENT DOCUMENTS

| | | |
|---|---|---|
| 4,589,111 A | 5/1986 | Adachi |
| 5,130,993 A | 7/1992 | Gutman et al. |
| 5,450,453 A | 9/1995 | Frank |
| 5,550,756 A | 8/1996 | Ohmi et al. |
| 5,675,703 A | 10/1997 | Sato |
| 5,881,104 A | 3/1999 | Akahane |
| 6,058,459 A | 5/2000 | Owen et al. |
| 6,137,784 A | 10/2000 | Wallerius et al. |

(Continued)

FOREIGN PATENT DOCUMENTS

| | | |
|---|---|---|
| EP | 0 771 092 A1 | 5/1997 |
| EP | 1187386 A1 * | 3/2002 |
| WO | WO 99/22481 | 5/1999 |

OTHER PUBLICATIONS

Hagenauer, Joachim, et al., "A Viterbi Algorithm with Soft-Decision Outputs and its Applications", Dallas Globecom '89, IEE Global Telecommunications Conference & Exhibition, Dallas, Texas, Nov. 27-30, 1989.

(Continued)

*Primary Examiner*—R. Stephen Dildine
(74) *Attorney, Agent, or Firm*—Potomac Patent Group PLLC (57) ABSTRACT

In a packet-based data transmission including incremental redundancy (IR) protocols, the memory consumption of the IR protocol is reduced by compressing and storing failed data units in their punctured format. The failed data units are compressed using low complexity compression/decompression algorithms. The compression algorithm includes two parts: calculating and storing a scale factor for each transmission burst that estimates the soft values in the burst, and storing each soft values' sign in local memory instead of the complete soft value. If the currently received data unit is a retransmission, its compressed versions in the punctured format stored in the IR memory are decompressed, de-punctured and combined with the currently received data unit. The combined data unit is then decoded. The decompression restores an estimated soft-value by multiplying the sign value stored in the IR memory with its corresponding scale factor obtained from a mapping table.

17 Claims, 8 Drawing Sheets

U.S. PATENT DOCUMENTS

| | | |
|---|---|---|
| 6,247,150 B1 | 6/2001 | Niemela |
| 6,347,124 B1 | 2/2002 | Antia et al. |
| 6,366,545 B2 | 4/2002 | Koyata |
| 6,400,928 B1 | 6/2002 | Khullar et al. |
| 6,529,561 B2 | 3/2003 | Sipola |
| 6,668,089 B1 | 12/2003 | Bracamonte et al. |
| 6,711,709 B1 | 3/2004 | York |
| 6,718,507 B1 | 4/2004 | Johnston et al. |
| 6,744,766 B2 | 6/2004 | Alapuranen |
| 2002/0107987 A1 | 8/2002 | Malm |
| 2002/0159545 A1 | 10/2002 | Ramesh et al. |

OTHER PUBLICATIONS

PCT International Search Report, dated Jan. 19, 2005, in connection with International Application No. PCT/EP2004/009346.

PCT Written Opinion, dated Jan. 19, 2005, in connection with International Application No. PCT/EP2004/009346.

European Search Report, dated Aug. 9, 2001, in connection with U.S. Appl. No. 09/735,495.

Bell, Timothy C. et al., "The Relationship between Greedy Parsing and Symbolwise Text Compression", Journal of the Association for Computer Machinery, vol. 41, No. 4, Jul. 1994, pp. 708-724.

Vitter, Jefffrey Scott et al., "Optimal Prefetching via Data Compression," Journal of the ACM, vol. 43, No. 5, Sep. 1996, pp. 771-793.

Hagenauer, Joachim et al., "A Viterbi Algorithm with Soft-Decision Outputs and its Applications," in Proc. Globecom, Dallas, TX, Nov. 1989, pp. 1680-1686.

* cited by examiner

```
for burstNum = 1 to 4
    Sum = 0;
    for pos = 1 to BurstLength
        Sum = sum + receivedVector[burstNum, pos];
    end //pos
    ScaleVector[burstNum] = sum/BurstLength
End //burst
```

FIG. 7A

```
for pos = 1 to pduLength
    if puncturedVector[pos] < 0
        storedVector[pos] = 1;
    else
        storedVector[pos] = 0;
end //pos
```

FIG. 7B

```
For pos = 1 to pduLength
    decompressedVector[pos] = storedVector[pos] * scaleVector[scaleIndexTable[pos]];
End //pos
```

FIG. 7C

```
For pos=1 to unpuncturedPduLength
    if (scaleindexTableUnpunctured[pos] == 0)
        decompressedVector[pos] = 0
    else
        decompressedVector[pos] = storedVector[pos] * scaleIndexTableUnpunctured[pos]
    end
end
```

FIG. 7D

```
combinedVector[ ] = newDepuncturedVector[ ];
for I = 1 to numIREntries
    if (IREntry[i] -> BSN = = currentBSN and
        IREntry[i]->SPB == currentSPB)
        decompressedVector[ ] = decompress(IREntry[i]);
        depuncturedVector[ ] = depuncture(decompressedVector[ ],
                                          IREntry[I].MSC);
        combinedVector[ ] = combinedVector[ ] + depuncturedVector[ ];
    end //if
end //
```

FIG. 7E

DATA COMPRESSION WITH INCREMENTAL REDUNDANCY

RELATED APPLICATIONS

This application is a Continuation-in-Part of U.S. application Ser. No. 09/735,495, filed Dec. 14, 2000 now U.S. Pat. No. 6,981,060, and a Continuation of U.S. application Ser. No. 10/645,560 filed Aug. 22, 2003, the entire contents of which both are incorporated hereby reference.

FIELD OF THE INVENTION

The invention relates to communication systems, and more particularly to techniques for providing incremental redundancy in radio systems that employ soft-decision decoding

BACKGROUND OF THE INVENTION

Figure 1:
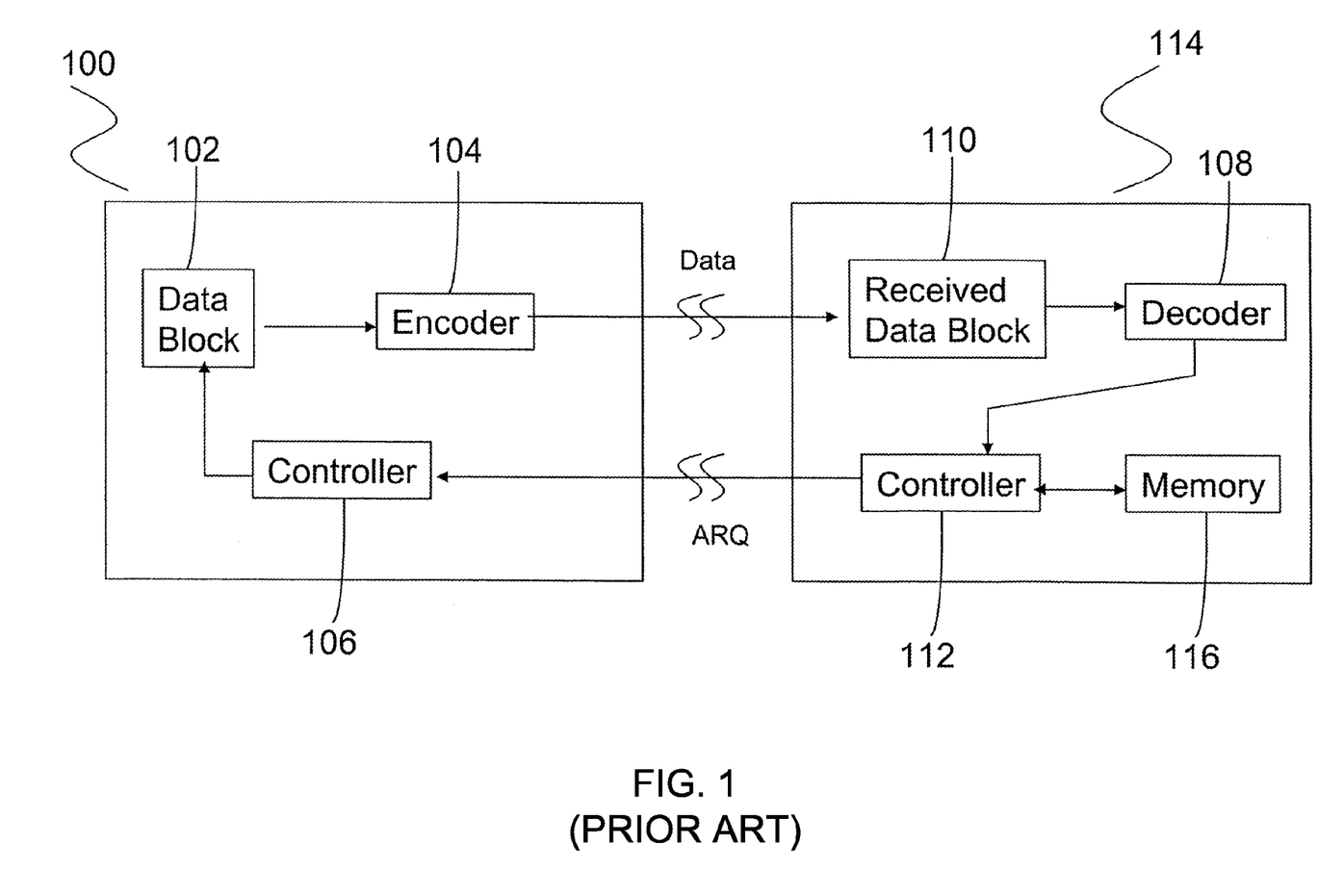
FIG. 1 shows a block diagram of a typical communication system.

Packet-based data transmission has become increasingly popular in communication systems including land-mobile radio networks. Packet transmission opens up the possibility of improving the user's throughput by retransmitting failed data packets. Several different retransmission protocols, all based on automatic repeat request (ARQ), offer this functionality. In hybrid ARQ protocols, when a data block fails channel decoding, it is usually stored in a local memory in the receiver and a request for retransmission of the failed block is sent to the transmitter. Then, upon receipt of the retransmitted data block, the retransmitted block is combined with the failed data block previously stored in memory. The combined block is then channel decoded. FIG. 1 shows a block diagram of a typical communication system, which may employ a hybrid ARQ based protocol.

As shown in FIG. 1, an exemplary transmitter 100 includes an encoder 104 and a controller 106. Likewise, receiver 114 includes a decoder 108, memory 116 and a controller 112. In transmitter 100, the payload, together with header and checksum information (shown as a data block 102), is encoded by encoder 104 to add redundancy to the data block. The data redundancy helps the receiver to perform forward error correction (FEC). In order to reduce the number of bits in the coded block, bits are removed using a puncturing pattern to form a punctured coded block. After the block is received, the decoder 108 decodes the block header in order to obtain the parameters required to decode the data unit. The decoder then decodes the received data unit and verifies the checksum. If the received data unit fails the decoding process (i.e., it has errors that cannot be corrected), the controller 112 sends an automatic retransmission request (ARQ) to transmitter 100 to retransmit this data unit. After receipt of an ARQ for a particular block, controller 106 resends the requested block. When the retransmitted data block is received, the receiver combines the retransmitted data unit with the failed data unit stored in memory. The receiver then decodes the combined data unit and verifies the checksum.

A hybrid ARQ protocol can be classified as either Type I hybrid ARQ or Type II hybrid ARQ, depending on what is retransmitted. In Type I, the requested data block is retransmitted in the same manner as the original transmission (i.e., the data block is encoded and punctured using the same code and puncturing scheme as the original data block). Therefore, a Type I hybrid ARQ system employs fixed redundancy in retransmission. In Type II, however, the retransmitted blocks contain different redundant bits (i.e., the retransmitted data block and the failed data block may not be encoded and/or punctured in the same manner).

In Type II hybrid ARQ, each time a data block fails the decoding process, the retransmitted data block may contain different redundant bits. Therefore, it can be desirable to store more than one failed data block. Accordingly, a received data unit may be combined with one or more previously failed data units prior to decoding. This results in more redundancy in the combined data unit, and an increased possibility of successful decoding in Type II hybrid ARQ systems. This process of retransmitting the failed data unit with additional redundant bits can be repeated until successful decoding is achieved (or until it is decided to give up further attempts to decode the block). In other words, the redundancy is achieved incrementally. Therefore, the Type II hybrid ARQ is also referred to as incremental Redundancy (IR) hybrid ARQ.

Figure 2:
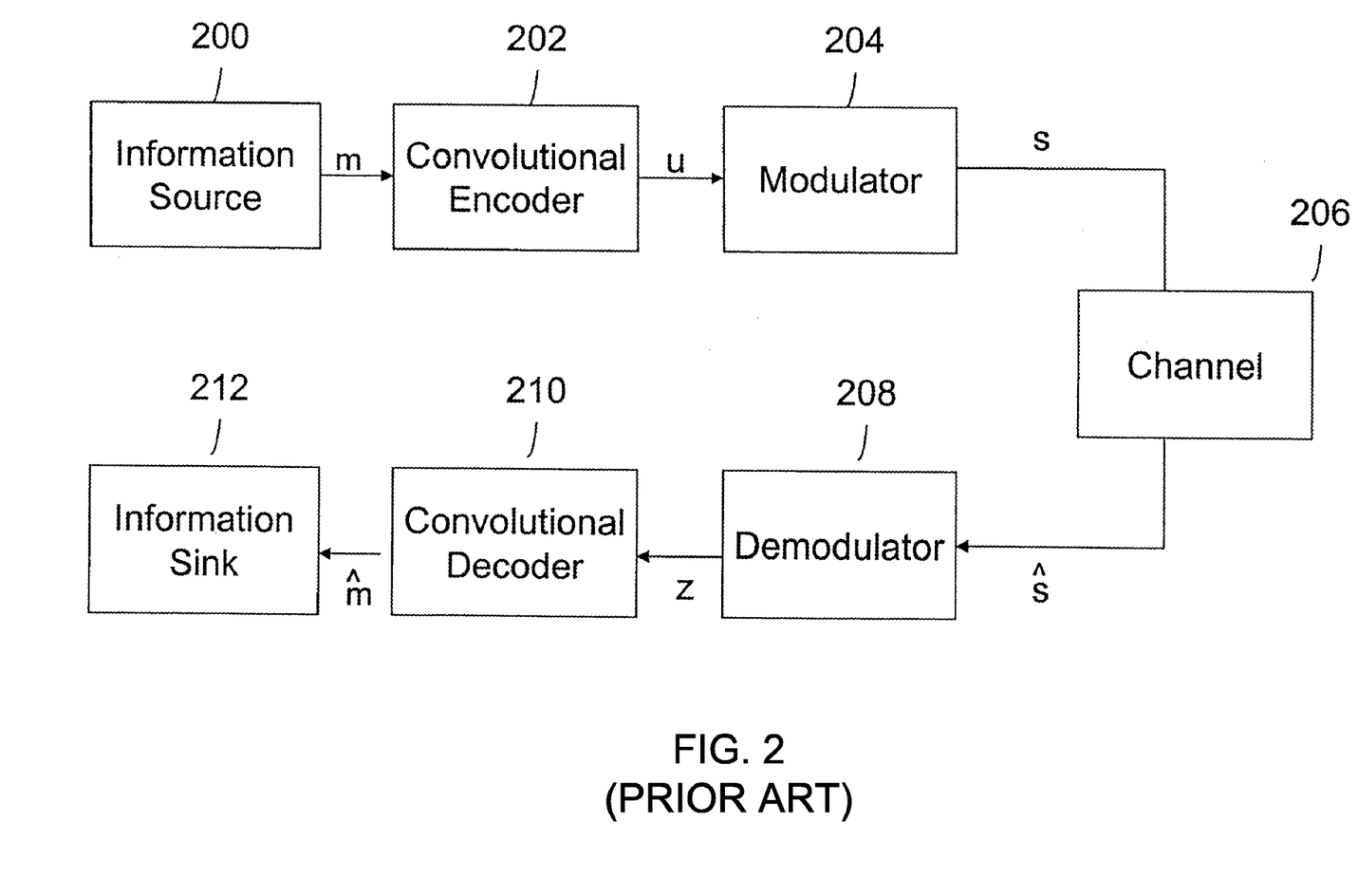
FIG. 2 shows a block diagram of the modulation/demodulation and coding/decoding of a communication link.

In addition to ARQ protocols, convolutional coding/decoding is commonly used in wireless communication systems. FIG. 2 shows a block diagram of the modulation/demodulation and coding/decoding of a communication link. The information, m, received from information source 200 is convolutionally encoded, by encoder 202, into coded bits, U, to add data redundancy. The coded bits, grouped into symbols, are then modulated into waveform S, by modulator 204. The waveform is then sent over channel 206 to the receiver. During the transmission, the waveform can be corrupted by noise, resulting in a received waveform Ŝ, which is different from S. The demodulator 208 demodulates the corrupted waveform Ŝ into the demodulated sequence, Z. Decoder 210 creates an estimate, m̂ of m by convolutionally decoding the demodulated sequence Z. The estimate m̂ is then provided to information sink 212.

It has been found that for systems employing convolutional decoding a quantized version of Z (i.e., soft-decision decoding) is better than a sequence of Z that has only two levels (i.e., hard-decision decoding). When soft-decision decoding is employed in an IR system more data has to be stored. For example, in one of the modulation and coding schemes of the Enhanced General Packet Radio Service (EGPRS), MCS-9, there are 2 packet data units (PDUs) in a radio block, each of which has 612 bits. In the receiver, the demodulator typically provides the decoder with a 16-bit soft value for each received bit in Z. Therefore, in order to provide incremental redundancy, the receiver needs at least 2.4 KB of memory to store these two PDU's in this radio block. To store 256 radio blocks in the receiver would therefore require 712 K bytes of memory to store the soft-values for the decoder.

The size of the memory within a mobile terminal is preferably minimized due to the cost and power consumption associated with large amounts of memory. Thus, a small amount of memory decreases cost and prolongs the operational time of the mobile terminal. Accordingly, the amount of memory required to provide incremental redundancy as discussed above is almost always prohibitively large for mobile applications.

However, the advantages of hybrid ARQ systems that employ incremental redundancy make it desirable (and in some instances mandatory, such as in EGPRS systems) to apply IR in wireless communications. Because implementing IR is very expensive in terms of memory storage in the receiver, methods of compressing the data blocks have been developed.

One way of reducing the memory-size is to compress the failed blocks prior to storing them. Each received block of coded data consists of a large number of symbols, and each symbol is represented in the receiver by a bit-vector of length L. Compression enables each symbol to be represented by a bit-vector of shorter length K, where K<L, which, in turn, results in a smaller memory size in the receiver.

However, the compression algorithm must be complemented with a decompression algorithm in order to decompress and combine stored data units with their corresponding retransmissions. Furthermore, the combination of compression/decompression algorithms can lead to increased implementation complexity. Consequently, the electrical power saved as a result of using a smaller memory may be wasted if highly complex compression/decompression algorithms are used.

Because the storage format of the failed data units has a direct relation with memory size, a need exists for an efficient format for storing failed data units in systems that employ IR.

SUMMARY OF THE INVENTION

As a solution to the above-described problems, the invention, according to exemplary embodiments, provides techniques for efficient storage of failed packet data units (PDUs) in systems that employ incremental redundancy.

According to one exemplary embodiment of the invention, a received transmission is processed to retrieve a PDU. The PDU is then de-punctured and decoded. If the decoded PDU contains errors, then the PDU, in its punctured format, is stored in memory and a request for retransmission is sent to the transmitter. Alternatively, the PDU can be stored in its de-punctured format.

According to another exemplary embodiment of the invention, the receiver generates a sequence of soft-values representative of each bit in a received transmission and a scale factor, representative of the soft-values within the sequence, is then calculated and stored. A sub-sequence, representative of a PDU is generated, and the sub-sequence is then de-punctured according to the associated puncturing scheme and decoded. If the decoded sub-sequence contains errors, then the sub-sequence of soft-values is compressed and stored in memory.

According to another exemplary embodiment of the invention, the receiver determines, prior to decoding the currently received de-punctured PDU, if there are any corresponding compressed sequences stored in memory. If there are compressed sequences stored in memory, then for each corresponding compressed sequence, the receiver: decompresses the sequence; de-punctures the decompressed sequence; and combines the de-punctured, decompressed sequence with the currently received, de-punctured sequence. The resulting combined sequence is decoded and if there are any errors, the currently received sequence, in its punctured format, is compressed and stored in memory.

It shall be emphasized that the term "comprises/comprising" when used in this specification is taken to specify that presence of stated features, integers, steps or components but does not preclude the presence or addition of one or more other features, integers, steps, components or groups thereof.

BRIEF DESCRIPTION OF THE DRAWING FIGURES

The objects and advantages of the invention will be understood by reading the detailed description in conjunction with the drawings, in which.

DETAILED DESCRIPTION OF THE INVENTION

The various features of the invention will now be described with respect to the figures, in which like parts are identified with the same reference characters.

In the following description, for purposes of explanation and not limitation, specific details are set forth, such as particular steps, algorithms, techniques, circuits and the like, in order to provide a thorough understanding of the invention. However, it will be apparent to one of ordinary skill in the art that the invention may be practiced in other embodiments that depart from these specific details. In other instances, detailed descriptions of well-known methods, devices, and circuits are omitted so as not to obscure the description of the invention with unnecessary detail.

These and other aspects of the invention will now be described in greater detail in connection with a number of exemplary embodiments. To facilitate an understanding of the invention, many aspects of the invention are described in terms of sequences of actions to be performed by elements of a computer system or apparatus. It will be recognized that in each of the embodiments, the various actions could be performed by specialized circuits, by program instructions being executed by one or more processors, or by a combination of both. Moreover, the invention can additionally be considered to be embodied entirely within any form of computer readable storage medium having stored therein an appropriate set of computer instructions that would cause a processor to carry out the techniques described herein. Thus, the various aspects of the invention may be embodied in many different forms, and all such forms are contemplated to be within the scope of the invention.

Figure 3:
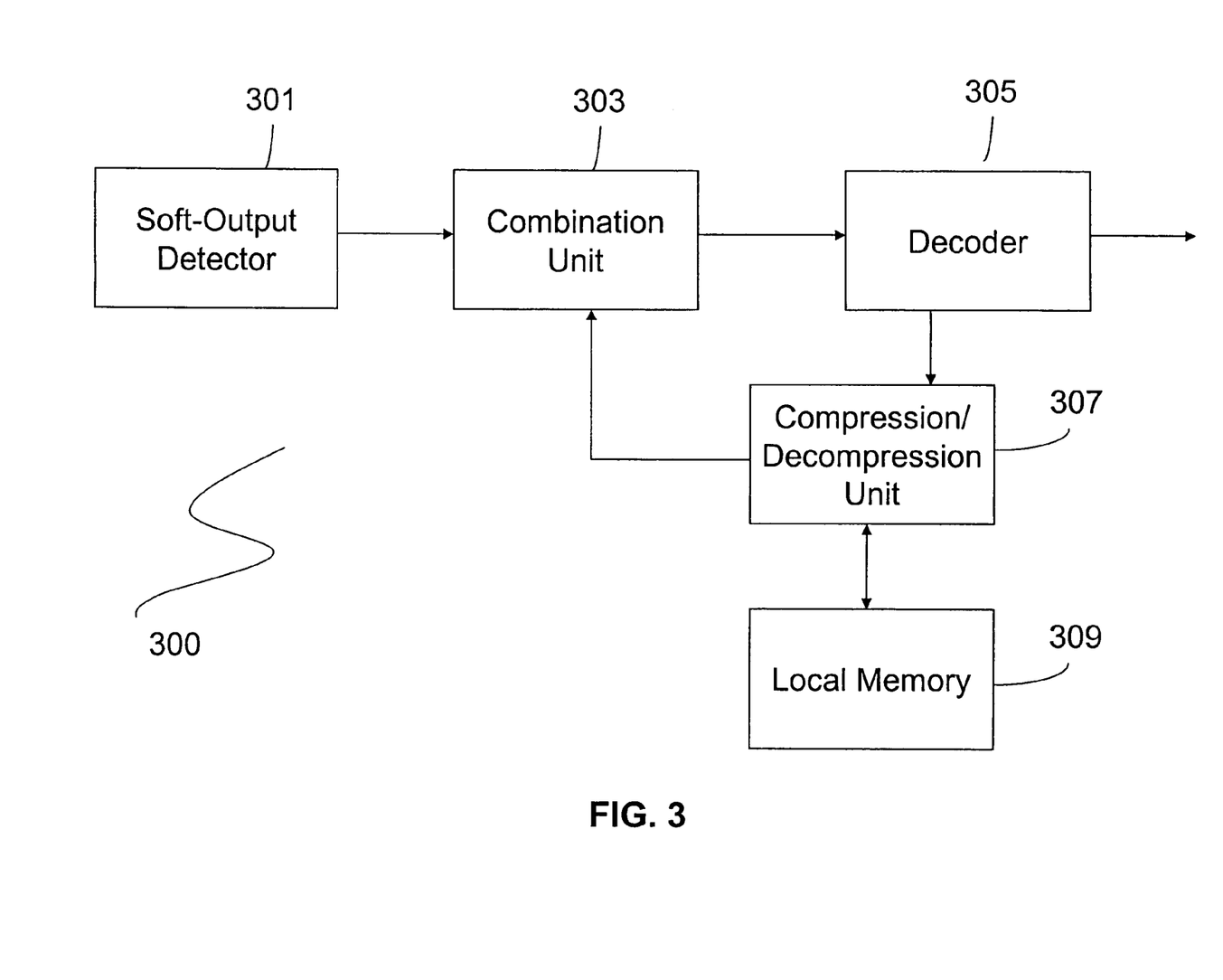
FIG. 3 shows a block diagram of the receiver chain according to an embodiment of the invention.

FIG. 3 shows a block diagram of the receiver chain according to an exemplary embodiment of the invention. The soft output detector 301 employs a soft output Viterbi algorithm (SOVA) such as that described by J. Haenauer and P. Hoeher, "A Viterbi algorithm with soft-decision outputs and its applications", in Proc. Globecom, Dallas, Tex., November 1989, pp 1680-1986. Thus, the output of the soft output detector 301 is in the form of soft values for each individual bit within the received radio block. In the exemplary embodiment, each soft value is in the form of the log of the ratio of the probability that the received bit represents a particular value versus the probability that it represents a different value. For example, the ratio may be the probability that the bit is a zero over the probability that the bit is a one. The soft-values are de-swapped and de-interleaved in order to restore the soft-values to the order of the original coded block. (Swapping and interleaving are well-known processes performed at the transmitter in order to reduce the effects of fading that occurs on the channel.) The soft values representative of the bits within the data unit are then fed to the combination unit 303.

If the presently received data unit is a retransmitted data unit (i.e., the data unit was transmitted in a previous radio block and failed the decoding process) then the soft values representing the currently received data unit are combined with the soft values of the corresponding failed data unit which were stored in local memory 309. The combined data unit is then fed to decoder 305. If the currently received data unit is not a retransmitted data unit, then it is fed directly to the decoder 305. Where, as in this example, the likelihood values represented by the soft values are scaled logarithmically, the form of the combination can be addition, which results in another likelihood value. Where logarithmic scaling is not used, the likelihood values should instead be combined by means of multiplication. For still other forms of soft values, different methods of combination can be used. The particular form of combination is not an essential aspect of the invention.

The combined data unit is then fed to the decoder 305, which decodes the channel code and outputs the estimated transmitted bit-sequence. In packet-based transmission systems, the blocks include some sort of error detection bits, such as cyclic redundancy check (CRC) or parity bits. The decoder 305 uses the error detection bits to determine if the decoded data unit includes any errors. If the combined data unit or the currently received data unit fails the decoding process, retransmission of the currently received data unit is requested in accordance with the applicable ARQ protocol and the currently received data unit is compressed and stored in memory for later use.

The failed data units (i.e., those data units which are not successfully decoded) are fed to compression/decompression unit 307, where they are compressed and stored in local memory 309. When a retransmitted data unit arrives it is combined with its corresponding failed data unit which, before combination, has been decompressed by compression/decompression unit 307.

Assuming that the fading channel and the interference are both constant during the transmission of a radio block or burst, the signal-to-interference and noise ratio (SINR) is constant for the whole radio block or burst. This assumption is valid for many land mobile radio scenarios which suffer fading and interference. One consequence of a constant SINR is that the absolute value of the soft values generated by detector 301 are in the same range for the entire radio block or burst. This property is used to compress the soft values in a simple and efficient way.

The compression algorithm according to an exemplary embodiment of the invention basically has two parts. First, the compression algorithm calculates one scale factor α that serves as an estimate of all the soft values representative of the bits within the received data unit. This scale factor can, for example, be the average of the absolute value of the soft values in the data unit. However, the use of an absolute average calculation is not an essential feature of the invention. Other scale value calculations may be used in alternative embodiments since it is the channel decoder that determines how the scale factor should be calculated to obtain optimal performance. Second, the compression algorithm stores the sign of each of the soft values representative of the bits within the data unit.

Assume, for example, that the following data unit with N soft values has been received $$\underline{s} = [s_1, s_2, \ldots, s_N] \quad (1)$$

where $s_1$ is the first soft value in the unit and so forth. The scale factor α is a function f(•) of the soft values, $$\alpha = f(\underline{s}). \quad (2)$$

An example of a suitable function could be the absolute average, $$f(s) = \frac{1}{N} \sum_{i=1}^{N} |s_k|. \quad (3)$$

The compressed data (i.e., the sign values) to be stored in the local memory can be generated as $$c = \left[ \frac{s_1}{|s_1|}, \frac{s_2}{|s_2|}, \ldots, \frac{s_N}{|s_N|} \right] \text{ if } s_k \neq 0, 1 \leq k \leq N, \quad (4)$$

or else, $c_k=1$ if $s_k=0$. The vector c hence consists of the soft values' signs. Since one bit is sufficient to store a soft value's sign, the memory consumption for a data unit with N soft values is N bits. The scale factor is also stored, preferably with high accuracy, in the local memory. This increases the memory consumption, in bits, with the word length of the scale factor. However, the relative memory increase attributable to storage of the scale factor becomes smaller as the size of the data unit increases.

The decompression algorithm according to an exemplary embodiment of the invention multiplies each stored soft value sign by its associated scale factor. Hence, the decompression algorithm is basically a multiplication of the stored data unit $\underline{c}$ with the accompanying scale factor. Thus, $$\underline{\hat{s}} = \alpha c = \alpha[c_1, c_2, \ldots, c_N], \quad (5)$$

is the decompressed data unit. This is suitable for use in a mobile receiver because it is a simple operation in a digital signal processor that does not add much complexity. Then, where the data unit was compressed in its punctured format, the data unit is de-punctured according to its associated puncturing scheme. The de-punctured, decompressed data unit is then ready for use, such as by combining it with a retransmitted data unit before a new channel decoding attempt is made. Alternatively, the data unit can be compressed in its de-punctured format, eliminating the need to de-puncture the decompressed data unit prior to combining it with a retransmitted data unit. However, in this case, because zeros are entered in the position corresponding to the punctured bit positions, these bit positions need to be restored back to zeros in the decompressed data unit.

The above-described compression/decompression algorithm assumes that the SINR is constant over the whole data block. However, this is not the case is all systems. For example, in EGPRS systems, a radio block consists of four transmission bursts. Therefore, each of the individual bits of a data block may be transmitted over different bursts. Accordingly, the above-described compression/decompression algorithm must be modified to account for the multiple transmission bursts (this modified algorithm in accordance with the exemplary embodiments of the invention is herein referred to as "burst-wise" compression).

According to EGPRS protocols, a radio block consists of four bursts transmitted in the same time slots in four consecutive TDMA frames. This radio block comprises a header and one or two radio link control (RLC) data blocks (PDUs). The header includes the modulation and coding scheme (MCS) and other information necessary for decoding the PDUs. The EGPRS data blocks use either GMSK or 8PSK modulation. There are nine modulation and coding schemes. Schemes 1-6 include one PDU in the Radio Link Control/Medium Access Control (RLC/MAC) block, whereas schemes 7-9 include two PDUs.

In the encoder, the header and the RLC data block(s) are processed separately (i.e., the header and the PDUs are separately coded). For further detail on the coding process, see GSM 05.03 specification. The coded PDUs are then punctured using one of the puncturing schemes (PS) associated with the PDU's MCS to form a fixed length radio block. The radio block is then interleaved and mapped to one of the four bursts in a radio block.

Figure 4A:
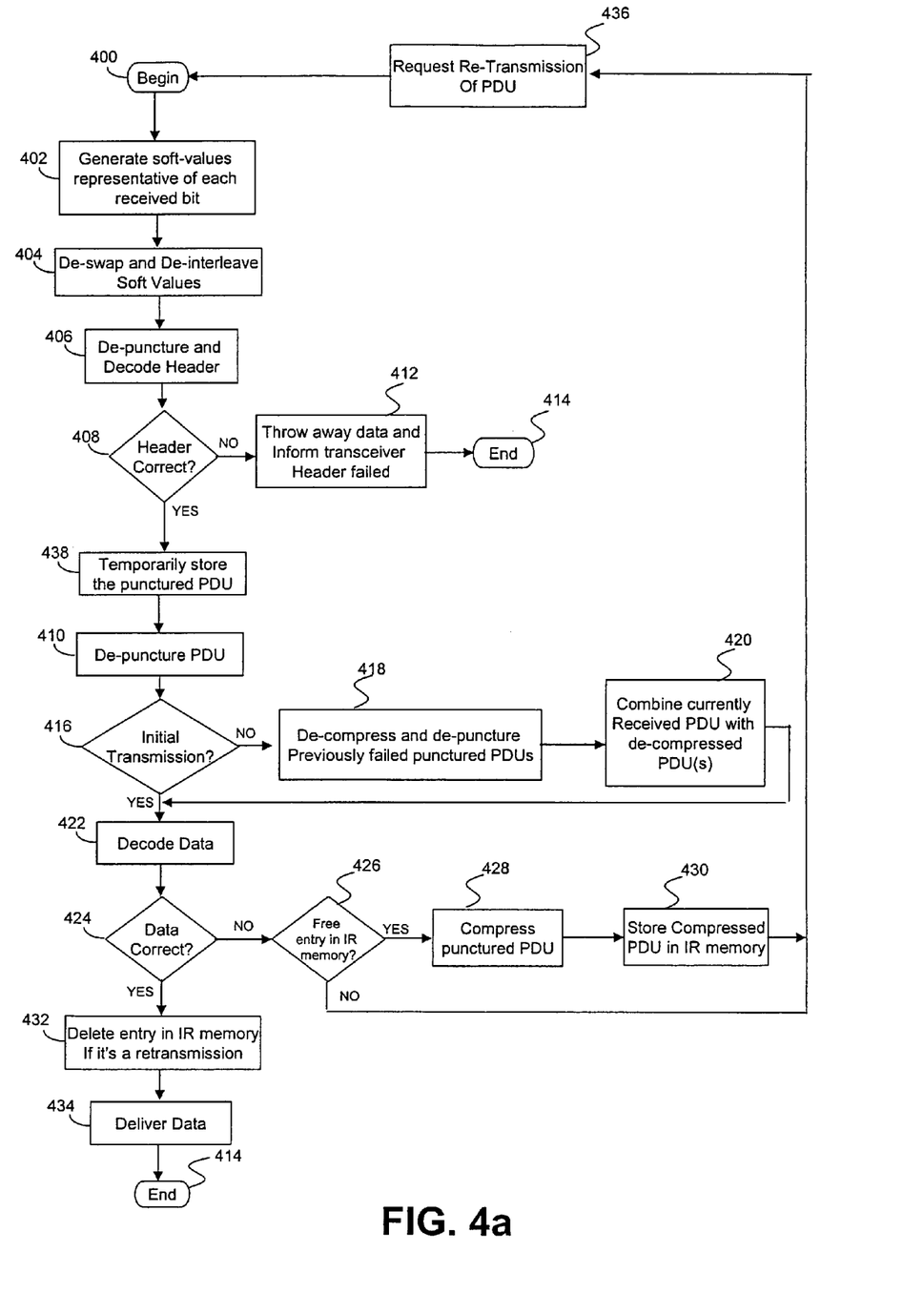
FIG. 4a shows a flow chart describing a method of storing failed data units according to an exemplary embodiment of the invention.

FIG. 4a describes an exemplary embodiment of the invention under the framework of EGPRS, however, the method(s) of the invention can be applied to all radio systems that employ soft-decision decoding. The process begins at step 402 where a sequence of soft values is generated by soft-output detector 301. In this embodiment, as in the embodiment discussed above, these soft values represent the ratio of the probabilities that a received bit represents one value versus another value, for example a 1 or −1. This sequence of soft-values is de-swapped and de-interleaved at step 404 such that the received bits represented by the soft values are restored to their original encoded RLC/MAC block order, which is necessary for the decoding process. The header is then depunctured and decoded at step 406 to obtain the decoding parameters, for example, the MCS, coding and puncturing scheme (PS), block sequence number (BSN) of the PDU (or PDUs if schemes 7-9 are employed), and the split-block flag (SPB) for schemes 1-4, required to decode the PDU(s). If the header is not decoded successfully ("NO" path out of decision block 408), the required decoding parameters can not be obtained and the PDU can not be decoded. Accordingly, the current radio block is thrown away and the transmitter is informed of the header failure at step 412.

If the header is decoded successfully ("YES" path out of decision block 408), the PDU is retrieved and temporarily stored at step 438. The PDU is then de-punctured at step 410. Control then proceeds to step 416 to determine whether or not the PDU has been previously transmitted, i.e., is the current PDU a re-transmission of a previously failed PDU. This can be achieved, in the exemplary embodiment, by checking if the PDU's BSN exists in the IR memory discussed in greater detail below.

If the current PDU is a re-transmission ("NO" path out of decision block 416), the corresponding failed PDUs (i.e., all the PDUs with the same BSN stored in memory 309) are decompressed at step 418, and de-punctured at step 440. The decompressed, de-punctured PDU is then combined with the currently received PDU at step 420. The combined PDU is then decoded at step 422. Otherwise ("YES" path out of decision block 422), the currently received de-punctured PDU is decoded at step 422.

At step 424, it is determined whether the currently received PDU ($1^{st}$ transmission of the block) or the combined PDU (re-transmission of the block) has failed the decoding process. If it fails the decoding process ("NO" path out of decision block 424), and there is a free entry in IR memory ("YES" path out of decision block 426), the currently received punctured PDU is compressed (step 428) and stored in memory 309 (step 430). According to an exemplary embodiment the PDU is compressed and stored in IR memory along with the supporting information required for decompression. If there is no IR memory left ("NO" path out of decision block 426), then the currently received PDU is not stored and a request for retransmission is sent to the transmitter (step 436). If the PDU is successfully decoded ("YES" path out of decision block 424) all entries with the same BSN as the currently received PDU are deleted from the IR memory at step 432, and the decoded data is delivered to the information sink at step 434.

When the receiver receives a new PDU, it checks whether the received block is a retransmission (as shown in step 416). If it is, the decompression algorithm decompresses and de-punctures the stored entry at step 418. The combination algorithm then combines the decompressed, de-punctured PDU(s) with the retransmitted PDU at step 420. If the retransmitted PDU employs the same puncturing scheme as a previously stored PDU, the most recently received PDU is combined with the previously stored PDU, which is then fed to the decoder for channel decoding. The current PDU is then used to replace the old PDU using the same puncturing scheme. However, it is perfectly acceptable to store all retransmissions, even if the same puncturing scheme has been used before. This increases memory usage and computation complexity. If the data is decoded successfully, the decoded data block is delivered and its related storage is deleted.

Figure 4B:
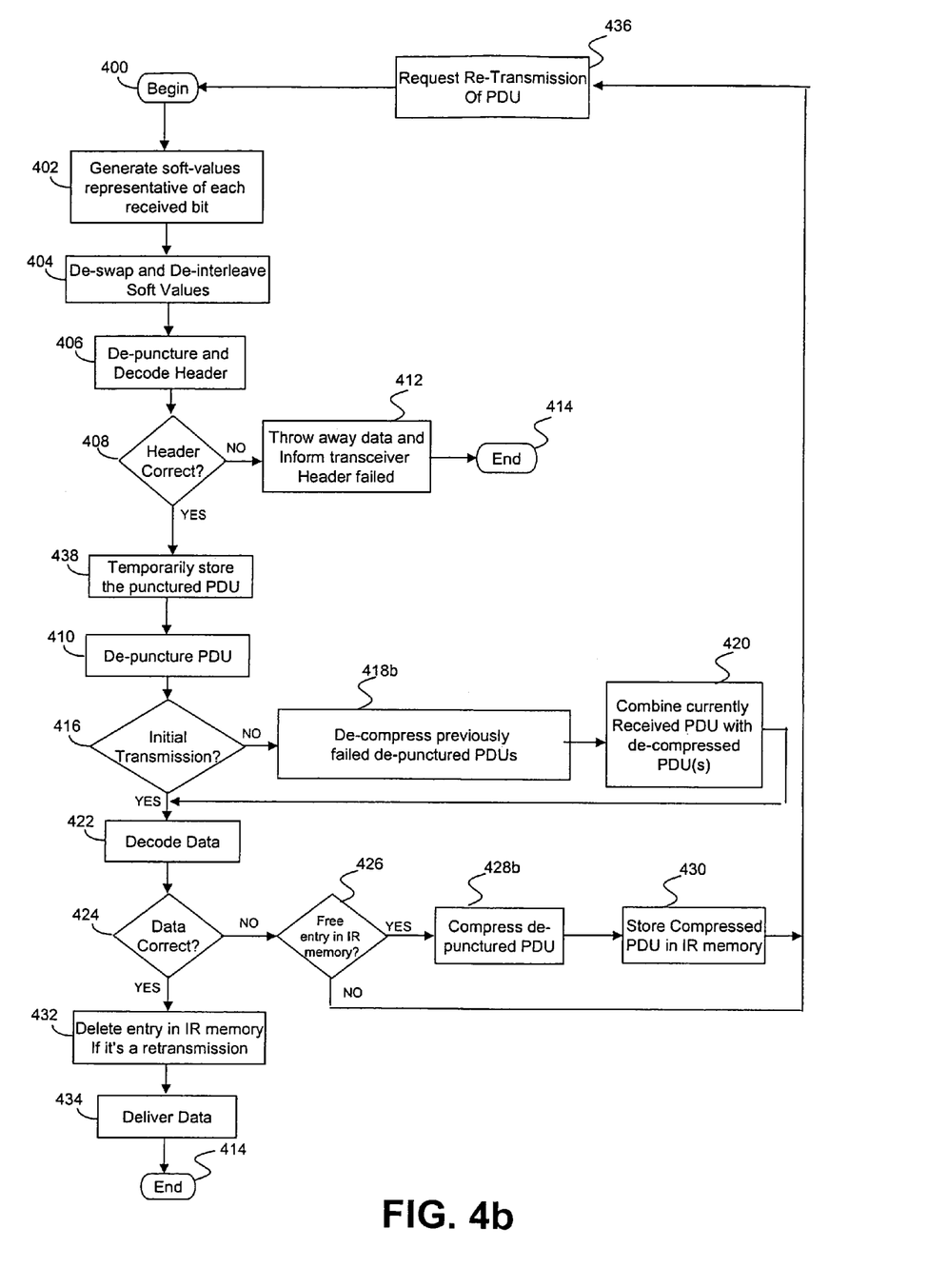
FIG. 4b shows a flow chart describing a method of storing failed data units according to another exemplary embodiment of the invention.

FIG. 4b describes an alternative embodiment wherein the PDU is compressed and stored in it's de-punctured format. The compression process is the same as that of the punctured format, with the exception of the sequence to be compressed being larger. However, because the de-puncturing process inserts zeros in the positions corresponding to the punctured bits, the decompression is different from that of the punctured format. Accordingly, for the compressed de-punctured PDU, the decompression algorithm sets zeros in the decompressed sequence for the position of the inserted zeros in the de-punctured PDU, and restores other bits in the sequence according to their burst scale factors and their sign stored in IR memory (step 418b). The decompressed PDU is then combined with the currently received PDU and decoded.

As discussed above, the compression algorithm in accordance with an embodiment of the invention is based on the assumption that the fading channel and the interference are both constant during the transmission of a data block. Therefore, in order to employ the compression algorithm to the above described EGPRS system burst-wise compression is employed as described below.

During burst-wise compression, a scale-factor is calculated for each of the transmission bursts. Assume the scale factor of burst $A^I$ (where A denotes a radio block punctured with a specific puncturing scheme PS1) is denoted $\alpha^I$, the scale-factor of burst $A^{II}$ is denoted $\alpha^{II}$, and so forth. Then, the vector $\bar{\alpha}[\alpha^I, \alpha^{II}, \alpha^{III}, \alpha^{IV}]$ represents the scale vector for the four A-bursts, $[A^I, \ldots, A^{IV}]$. Likewise, where multiple puncturing schemes are employed, the scale-vector for B-bursts is denoted by $\bar{\beta}$, and the scale-vector for C-bursts by $\bar{\gamma}$ (B and C denoting radio blocks punctured with puncturing schemes PS2 and PS3 respectively).

Figure 5:
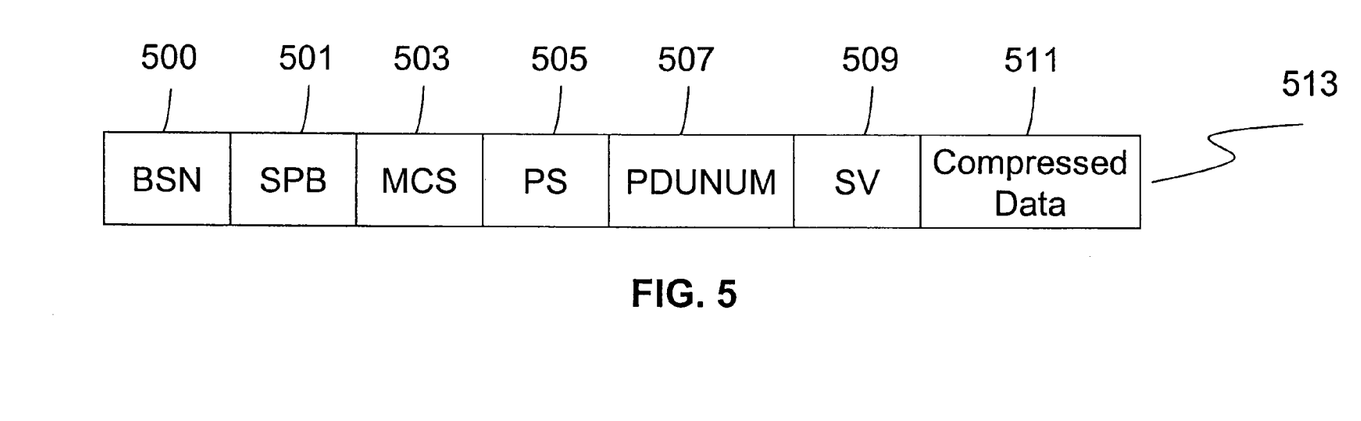
FIG. 5 shows the data structure of an entry in memory according to an exemplary embodiment of the invention.
Figure 6:
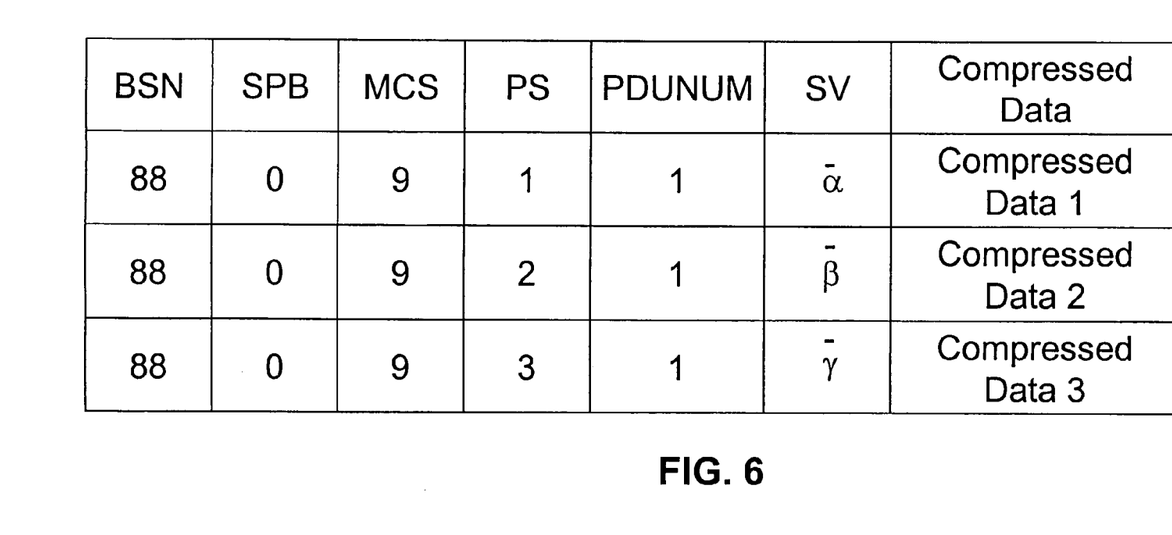
FIG. 6 shows an example of entries stored in accordance with an embodiment of the invention.

As discussed above, when a received PDU fails the decoding process, the punctured PDU is compressed and stored in local memory 309 along with the supporting information required for decompressing the PDU. An exemplary data structure of an entry in memory is shown in FIG. 5. The BSN field 500 designates the particular failed PDU. The SPB field 501 indicates whether the PDU has been split into two pieces for retransmission. This can occur when the retransmission coding scheme is too short to contain the entire message of the original transmission. Therefore, the retransmission is split into two pieces. When the retransmission occurs, the BSN is the same for both halves, so the SPB flag indicates which half was transmitted. The field PDUNUM 507 indicates the PDU number in the RLC/MAC block, which is only meaningful for MCS-7, -8 and -9, since they are the only ones that contain two PDUs. The PDUNUM field, together with the MCS 503 and the PS 505 fields, store information that is needed in the decompressing, de-puncturing, and decoding process. The SV field 509 stores the scale vector of the four bursts the PDU was transmitted over, and therefore, it is an array of 4 elements. The Compressed Data field 511 is where the compressed data is stored, i.e., the vector representing the sign of each soft-value in the PDU. Accordingly, the number of entries stored in the IR memory for a particular BSN, in the worst case, equals the number of puncturing schemes of the PDU's MCS. An example of a PDU that has a BSN of 88, using MCS-9, and has been transmitted at least three times, is shown in FIG. 6.

The main IR functions in accordance with the invention can be divided into two classes: the IR memory management class and the IR core class. The IR memory management class includes functions that initialize the IR memory, check whether a newly received PDU is a new transmission, find a free entry in the IR memory, and delete IR entries that are obsolete. The IR core class consists of functions that calculate the scale factor for a radio block, compress and store a PDU, decompress a compressed PDU, and combine all the PDU's having the same BSN and SPB with the current PDU for decoding.

Since a BSN is a non-negative number, the IR memory management can be easy to implement. We give one possible implementation here, but many other schemes for managing the IR memory are possible. Any negative number can be used to represent an empty entry in the IR memory. The IR initialization routine assigns a negative number to all the BSN fields in the IR entry table. After a PDU is received, the BSN of this PDU is compared to all the BSN in the table to check whether this is the initial transmission block. If the same BSN and SPB is found in the IR memory, then the block is a re-transmission. When a PDU is not successfully decoded (i.e., it is a failed PDU), it is necessary to determine if there is any empty IR entry left in the IR memory. An empty IR entry could be found by searching for a negative BSN field in the IR memory. If the entries with a particular BSN are not useful anymore, either because of the successful decoding or by being so informed by the communication controller, these entries are deleted by assigning a negative number to the BSN fields in the IR entry.

Figure 7A:
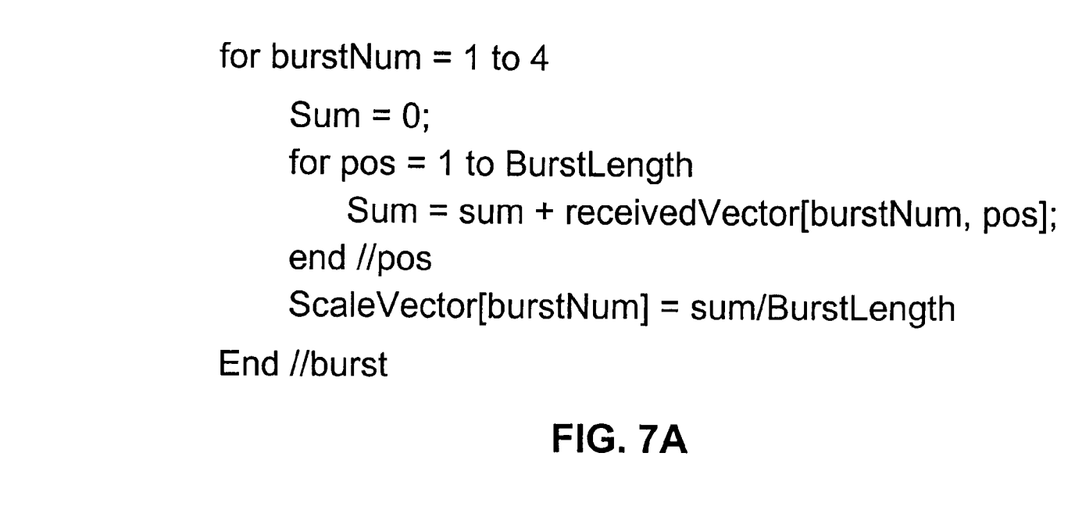
FIG. 7a shows exemplary pseudo code for calculation of burst-wise scale factor vector in accordance with an embodiment of the invention.

Exemplary pseudo code for calculating the burst-wise scale vector in accordance with an embodiment of the invention is shown in FIG. 7*a*. As shown, the vector, scaleVector[ ] stores the four scale factors corresponding to the four bursts of a radio block. The scale factors are calculated by taking the average of the soft values over a burst. As discussed above, each received bit in a burst is represented by a soft-value. These soft-values for each burst are stored in an X by Y array, receivedVector[burstNum, pos], where each column represents a new burst and the rows represent number of bits in the burst, burstLength. Accordingly, each soft-value in the array can be accessed by its burst number and representative bit position or number.

Figure 7B:
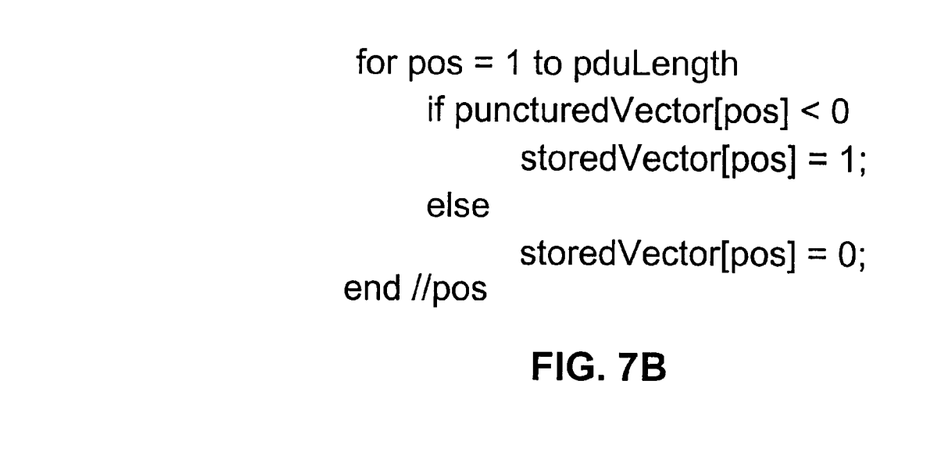
FIG. 7b shows exemplary pseudo code for compressing and storing the soft values in accordance with an embodiment of the invention.

Exemplary pseudo code for compression of the soft-values representative of the punctured PDU in accordance with the invention is shown in FIG. 7*b*, assuming the soft-values representing the bits of the punctured PDU are stored in puncturedVector[ ], and the number of bits in a punctured PDU is pduLength. As shown, for each bit in the PDU (i.e., 1 to pduLength), the value of the stored vector is set to 1 if the representative soft-value is less than 0, otherwise the value is set to 0.

Figure 7C:
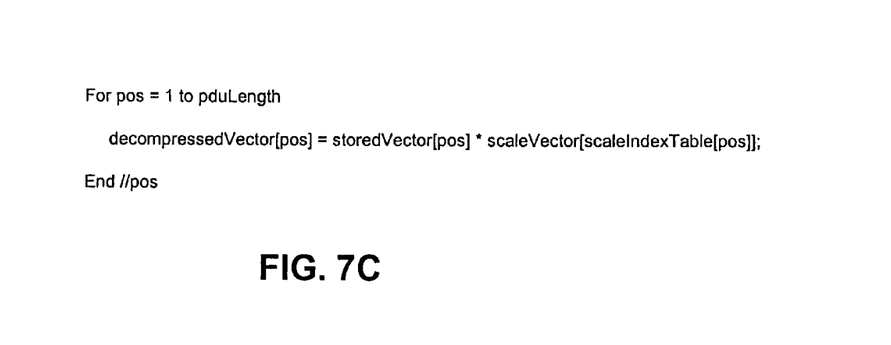
FIG. 7c shows exemplary pseudo code for decompressing the stored soft-values of a PDU in accordance with an embodiment of the invention.

The decompression process is shown in the exemplary pseudo code of FIG. 7*c*. Where, as in this example, the individual bits of a PDU are transmitted over a number of bursts, the burst that each bit in the PDU was transmitted in needs to be determined, so that the scale factor corresponding to the burst can be identified. Therefore, the table, scaleIndexTable[pos], is created to map the position of each bit in the PDU, pos, to the burst number that it was transmitted in. Accordingly, scaleIndexTable[ ] has a length of pduLength. The entries in scaleIndexTable[ ] have the value between 1 and 4, which indicates the burst number.

Figure 7D:
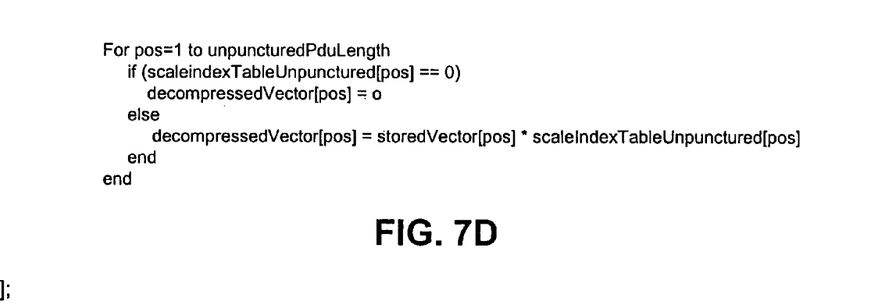
FIG. 7d show exemplary pseudo code for decompressing the stored soft-values of a PDU in accordance with another embodiment of the invention

The decompression process begins by retrieving the compressed soft-values from memory (e.g., the stored vector containing the sign values for each soft-value in the PDU), as shown in FIG. 7*c*. Each sign value is then multiplied by the corresponding scale factor, resulting in the vector, decompressedvector[ ], which contains the uncompressed soft-values for the punctured PDU. Alternatively, in the case where the PDU is compressed in its de-punctured format, the positions corresponding to punctured bits in the PDU restored with zeros, while the other bits are restored according to their burst scale factors and their signs stored in IR memory as shown in FIG. 7*d*.

Figure 7E:
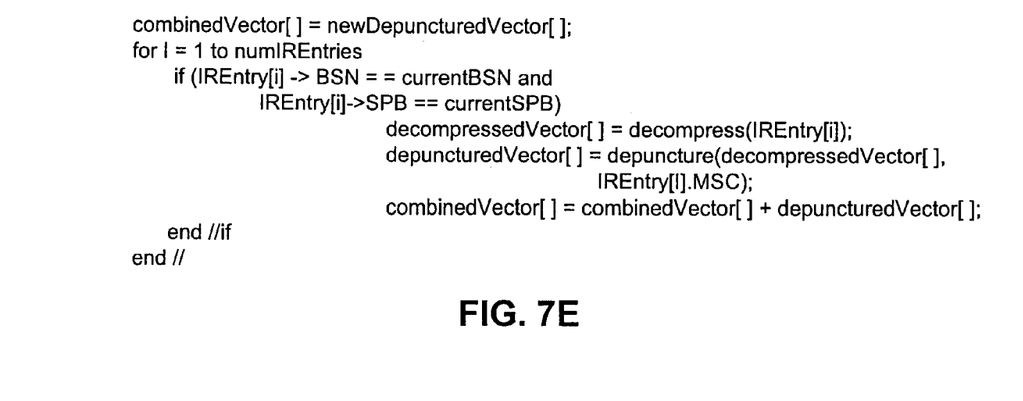
FIG. 7e shows exemplary pseudo code for combining PDUs in accordance with an embodiment of the invention.

Finally, exemplary pseudo code for the combining function is shown in FIG. 7*e*. The combining function combines the currently received de-punctured PDU with all of its previous transmissions. The previous transmissions are found by determining if there are any entries within the IR memory with the same BSN and SPB as the newly received PDU. If previous transmissions are found in the IR memory, they are decompressed one by one into decompressedVector [pos], depunctured into depuncturedvector[ ], and combined.

The combining process begins by assigning newly received de-punctured PDU, newDepuncturedVector[ ], to the vector, combinedvector[ ]. The function then searches from the first entry in the IR memory to the last entry, numIREntries, to find previous transmissions of the current PDU. If any previous transmission is found, it is first decompressed, using the decompression function, decompress (IREntry[I]) and then depunctured into the vector, depuncturedVector[ ], using the function depuncture(decompressedvector[ ], IREntry[I].mcs), according to the MCS parameter mcs. The depunctureVector[ ] is then combined with the combinedVector[ ]. Where, as in this example, the soft-values are likelihood values that are scaled logarithmically, the form of the combination can be addition, which results in another likelihood value. Accordingly, the depunctureVector[ ] and the combinedVector[ ] are combined by performing a value by value addition. This process is iterated until all the previous transmissions of the current PDU are combined. The combinedVector[ ] is then submitted to the decoder.

In receivers of the type described above, the compression/decompression algorithm may incur a small penalty in user data throughput. However, the advantage of the invention is the steep decrease in memory consumption compared to the uncompressed de-punctured data unit. The memory compression is roughly proportional to the inverse of the number of bits that represent an uncompressed symbol.

The invention has been described with reference to particular embodiments. However, it will be readily apparent to those skilled in the art that it is possible to embody the invention in specific forms other than those of the preferred embodiments described above. This may be done without departing from the spirit of the invention.

Thus the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method of storing failed packet data units (PDUs) in a packet-transmission system, in which the PDUs are encoded to include redundancy, and punctured according to a specified puncturing scheme prior to transmission, the method comprising:
   receiving a transmission;
   processing the received transmission to retrieve a PDU;
   de-puncturing the PDU;
   decoding the de-punctured PDU; and
   if the decoded PDU contains errors, then storing the PDU and requesting retransmission.
   wherein the step of storing the PDU comprises:
   compressing the PDU; and
   storing the compressed PDU.

2. The method of claim 1, wherein the PDU is transmitted over a plurality of different transmission bursts.

3. The method of claim 1, wherein the step of processing the received transmission comprises:
   generating a sequence of soft-values representative of each bit in the received transmission;
   calculating and storing a scale factor representative of the soft-values within the sequence; and
   generating a sub-sequence of soft-values representative of a transmitted PDU.

4. The method of claim 3, wherein the scale factor is an average of the absolute values of the soft-values within the sequence.

5. The method of claim 3, wherein the step of compressing the PDU comprises:
   storing the sign of each soft-value within the sub-sequence.

6. The method of claim 1, wherein the PDU is compressed in its punctured format.

7. The method of claim 6, further comprising:
   determining, prior to decoding the de-punctured PDU, if there are any compressed PDUs stored in memory that correspond to the currently received, de-punctured PDU;
   if there are any corresponding PDUs stored in memory then, for each corresponding PDU:
   decompressing the PDU;
   de-puncturing the decompressed PDU;
   combining the de-punctured, decompressed PDU with the currently received, de-punctured PDU;
   decoding the combined PDU; and
   if the decoded combined PDU contains errors, then compressing and storing the currently received punctured PDU.

8. The method of claim 1, wherein the PDU is compressed in its de-punctured format.

9. The method of claim 8, further comprising:
   determining, prior to decoding the de-punctured PDU, if there are any compressed PDUs stored in memory that correspond to the currently received, de-punctured PDU;
   if there are any corresponding PDUs stored in memory then, for each corresponding PDU:
   decompressing the PDU;
   combining the decompressed PDU with the currently received, de-punctured PDU;
   decoding the combined PDU; and
   if the decoded combined PDU contains errors, then compressing and storing the currently received de-punctured PDU.

10. The method of claim 9, wherein the step of processing the received transmission comprises:
   generating a sequence of soft-values representative of each bit in the received transmission;
   calculating and storing a scale factor representative of the soft-values within the sequence; and
   generating sub-sequence of soft-values representative of a transmitted PDU.

11. The method of claim 10, wherein the scale factor is an average of the absolute values of the soft-values within the sequence.

12. The method of claim 10 wherein the step of compressing the PDU comprises:
   storing the sign of each soft-value within the sub-sequence.

13. The method of claim 12, wherein the step of decompressing the corresponding PDU comprises:
   multiplying the stored sign of each soft-value in the sub-sequence by the stored scale factor.

14. A receiver comprising:
   a soft output detector configured to generate a sequence of soft-values representative of each bit within a received transmission;
   a decoder;
   local memory; and
   a processor, the processor comprising logic configured to:
   process the retrieved transmission in order to retrieve a PDU;
   de-puncture the PDU; and
   compress and store in the local memory the retrieved PDU if the de-punctured PDU fails the decoding process.

15. The receiver of claim 14, wherein the processor further includes logic configured to:
   determine, prior to decoding the de-punctured PDU, if there are any corresponding compressed PDUs stored in memory;
   for each stored PDU the logic is configured to:
   decompress the PDU;
   de-puncture the decompressed PDU;
   combine the de-punctured, decompressed, PDU with the currently received de-punctured PDU; and
   compress and store the retrieved PDU, if the decoded combined PDU fails the decoding process.

16. A computer-readable storage medium having stored therein one or more instructions that cause a processor to perform the steps of:
    processing a received transmission to retrieve a PDU;
    de-puncturing the PDU;
    decoding the de-punctured PDU; and
    if the decoded PDU contains errors, then compressing and storing the punctured PDU.

17. The computer-readable storage medium of claim 16, further comprising one or more instructions that cause a processor to perform the steps of:
    determining, prior to decoding the de-punctured PDU, if there are any corresponding compressed PDUs stored in memory;
    if there are compressed PDUs stored in memory then, for each compressed PDU:
        decompressing the PDU;
        de-puncturing the decompressed PDU;
        combining the de-punctured, decompressed, PDU with the currently received, de-punctured PDU;
        decoding the combined PDU; and
    if the decoded combined PDU contains errors, then compressing and storing the currently received punctured PDU.

\* \* \* \* \*

UNITED STATES PATENT AND TRADEMARK OFFICE
CERTIFICATE OF CORRECTION

PATENT NO. : 7,302,628 B2
APPLICATION NO. : 10/911297
DATED : November 27, 2007
INVENTOR(S) : Huang et al.

It is certified that error appears in the above-identified patent and that said Letters Patent is hereby corrected as shown below:

On the Title Page Item (73), under "Assignee", delete "L M" and insert -- LM --, therefor.

In Column 1, Line 17, after "decoding" insert -- . --.

In Column 2, Line 32, delete " $\tilde{m}$ " and insert -- $\hat{m}$ --, therefor.

In Column 6, Line 26, in Equation (3), delete " $\sum_{i=1}^{N}|S_k|$ " and insert -- $\sum_{k=1}^{N}|S_k|$ --, therefor.

In Column 6, Line 34, in Equation (4), delete "c" and insert -- $\underline{c}$ --, therefor.

In Column 6, Line 38, delete "c" and insert -- $\underline{c}$ --, therefor.

In Column 6, Line 53, in Equation (5), delete "αc" and insert -- α$\underline{c}$ --, therefor.

In Column 9, Line 2, delete "$\overline{\alpha}\lfloor\alpha^I, \alpha^{II}, \alpha^{III}, \alpha^{IV}\rfloor$" and insert -- $\overline{\alpha} = \lfloor\alpha^I, \alpha^{II}, \alpha^{III}, \alpha^{IV}\rfloor$ --, therefor.

In Column 10, Line 39, delete "decompressedvector[ ]" and insert -- decompressedVector[ ] --, therefor.

In Column 10, Line 54, delete "depuncturedvector[ ]" and insert -- depuncturedVector[ ] --, therefor.

In Column 10, Line 57, delete "combinedvector[ ]" and insert -- combinedVector[ ] --, therefor.

In Column 10, Lines 63-64, delete "decompressedvector[ ]" and insert -- decompressedVector[ ] --, therefor.

UNITED STATES PATENT AND TRADEMARK OFFICE
CERTIFICATE OF CORRECTION

PATENT NO. : 7,302,628 B2
APPLICATION NO. : 10/911297
DATED : November 27, 2007
INVENTOR(S) : Huang et al.

It is certified that error appears in the above-identified patent and that said Letters Patent is hereby corrected as shown below:

In Column 11, Line 38, in Claim 1, after "retransmission" delete "." and insert -- , --, therefor.

In Column 12, Line 35, in Claim 12, after "claim 10" insert -- , --, therefor.

Signed and Sealed this

Ninth Day of September, 2008

JON W. DUDAS
*Director of the United States Patent and Trademark Office*